(12) United States Patent
Ong et al.

(10) Patent No.: US 11,652,015 B2
(45) Date of Patent: May 16, 2023

(54) SEMICONDUCTOR PACKAGE WITH IMPROVED CLAMP

(71) Applicant: Littelfuse Semiconductor (Wuxi) Co., Ltd., Wuxi (CN)

(72) Inventors: Yong Ai Ong, Wuxi (CN); Chuyao Tai, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 139 days.

(21) Appl. No.: 17/182,571

(22) Filed: Feb. 23, 2021

(65) Prior Publication Data

US 2021/0265229 A1 Aug. 26, 2021

(30) Foreign Application Priority Data

Feb. 25, 2020 (CN) .......................... 202010117056.0

(51) Int. Cl.
*H01L 23/32* (2006.01)
*H01L 23/367* (2006.01)
*H01L 23/00* (2006.01)

(52) U.S. Cl.
CPC ............ *H01L 23/32* (2013.01); *H01L 23/367* (2013.01); *H01L 23/562* (2013.01)

(58) Field of Classification Search
CPC ...... H01L 23/32; H01L 23/367; H01L 23/562
See application file for complete search history.

(56) References Cited

U.S. PATENT DOCUMENTS

| 10,319,652 | B2* | 6/2019 | Lin ......................... H01L 23/10 |
| 2008/0158822 | A1 | 7/2008 | Stolze et al. |
| 2014/0285972 | A1 | 9/2014 | Hong et al. |
| 2018/0228041 | A1 | 8/2018 | Prajuckamol et al. |
| 2021/0210409 | A1* | 7/2021 | Han .................... H01L 23/4006 |

OTHER PUBLICATIONS

Extended European Search Report dated Jul. 21, 2021 for European Patent Application No. 21159093.0.

* cited by examiner

*Primary Examiner* — Peniel M Gumedzoe
(74) *Attorney, Agent, or Firm* — KDW Firm PLLC

(57) ABSTRACT

Provided herein are semiconductor packages with improved clamps. In some embodiments, a semiconductor package may include a housing having a wall extending from a main body, and a set of support walls extending from the wall. The semiconductor package may further include a clamp extending between the set of support walls, the clamp having a first planar section coupled to a first support wall of the set of support walls, a second planar section coupled to a second support wall of the set of support walls, and a third planar section between the first and second planar sections. The third planar section may include an opening operable to receive a fastener, and a plurality of stress relief openings.

19 Claims, 6 Drawing Sheets

SEMICONDUCTOR PACKAGE WITH IMPROVED CLAMP

FIELD OF THE DISCLOSURE

The disclosure relates generally to semiconductor device packaging and, more particularly, to semiconductor packages with improved clamps.

BACKGROUND OF THE DISCLOSURE

Semiconductor device packages often include elements to mount or otherwise couple the package to a printed circuit board (PCB) (motherboard) or to other elements. Such mounting elements sometimes include pins that are configured to be press-fit into pin receivers of a PCB/motherboard or other element. Some package types are provided with attachment mechanisms, such as clamps, for mechanically attaching the package to an underlying carrier, such as a printed circuit board or a ceramic carrier. These carriers may include a heat conducting element to which the package can be attached.

In some prior art approaches, the attachment mechanism does not provide suitable contact between the package and the carrier to which the package is attached. This poor attachment may reduce heat transfer between the package and the carrier. In other prior art approaches, stress on the clamp is high, which may cause deformation and cracks, which in turn lead to failure of the clamp and/or the semiconductor device package.

Accordingly, it is desirable to provide a semiconductor device package including an improved clamp offering enhanced heat transfer with reduced stress.

SUMMARY

In view of the foregoing, in one approach, a semiconductor package may include a housing having a wall extending from a main body, and a set of support walls extending from the wall. The semiconductor package may further include a clamp extending between the set of support walls, the clamp having a first planar section coupled to a first support wall of the set of support walls, a second planar section coupled to a second support wall of the set of support walls, and a third planar section between the first and second planar sections. The third planar section may include an opening operable to receive a fastener, and a plurality of stress relief openings.

In another approach, a power semiconductor package may include a housing, having a wall extending from a main body, and a first set of support walls and a second set of support walls extending from the wall. The power semiconductor package may further include a first clamp extending between the first set of support walls and a second clamp extending between the second set of support walls. Each of the first and second clamps may include a first planar section coupled to a first support wall of the set of support walls, a second planar section coupled to a second support wall of the set of support walls, and a third planar section between the first and second planar sections. The third planar section may include an opening operable to receive a fastener, and a plurality of stress relief openings.

In yet another approach, an assembly may include a heatsink, and a power semiconductor module coupled to the heatsink. The power semiconductor module may include a housing having a wall extending from a main body and a set of support walls extending from the wall. The power semi- conductor module may further include a clamp extending between the set of support walls, the clamp including a first planar section coupled to a first support wall of the set of support walls, a second planar section coupled to a second support wall of the set of support walls, and a third planar section between the first and second planar sections, wherein the third planar section includes an opening operable to receive a fastener, and a plurality of stress relief openings.

Figure 1:
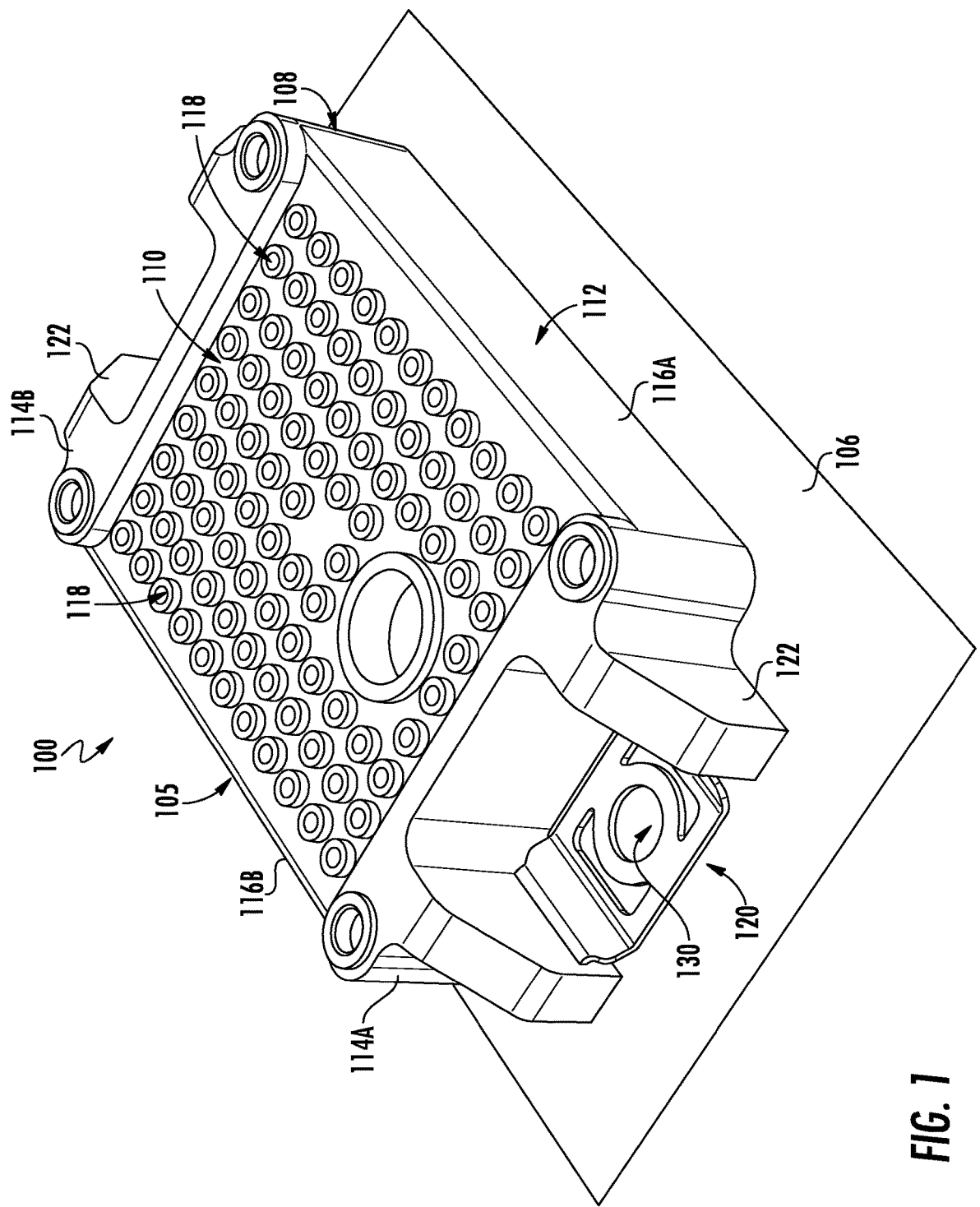
FIG. 1 is a perspective view of a semiconductor package atop a carrier according to exemplary embodiments of the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. The system/circuit and methods may be embodied in many different forms and should not be construed as being limited to the embodiments set forth herein. Rather, these embodiments are provided so that this disclosure will be thorough and complete, and will fully convey the scope of the system and method to those skilled in the art.

As mentioned above, embodiments herein advantageously provide a semiconductor device package including an improved clamp offering better heat transfer with reduced stress during mounting and higher reliability. A length of the clamp, as compared to prior art approaches, may be lengthened to enhance stability when the semiconductor device package is secured to a heatsink. Furthermore, stress in the clamp and the semiconductor device package, for example, when secured to the heatsink, may be reduced through one or more cutouts formed through a central portion of the clamp. Although non-limiting, the semiconductor device package described herein may be applicable for power applications in various settings, such as an automobile (electric or gas), a wind turbine, a solar power panel, a power plant, an industrial machine, and so forth.

Figure 2:
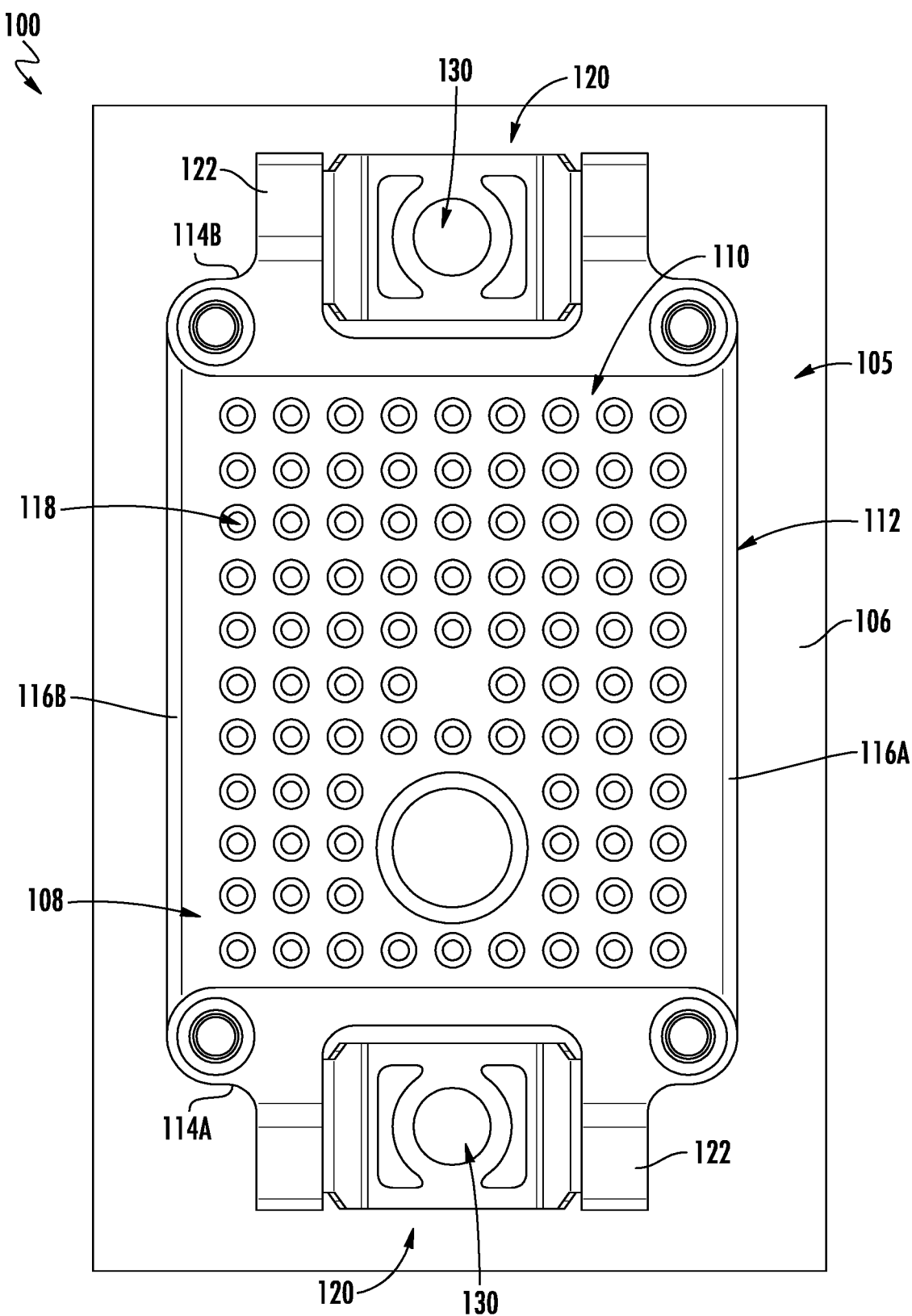
FIG. 2 is a top view of the semiconductor package and carrier of FIG. 1 according to exemplary embodiments of the present disclosure.
Figure 3:
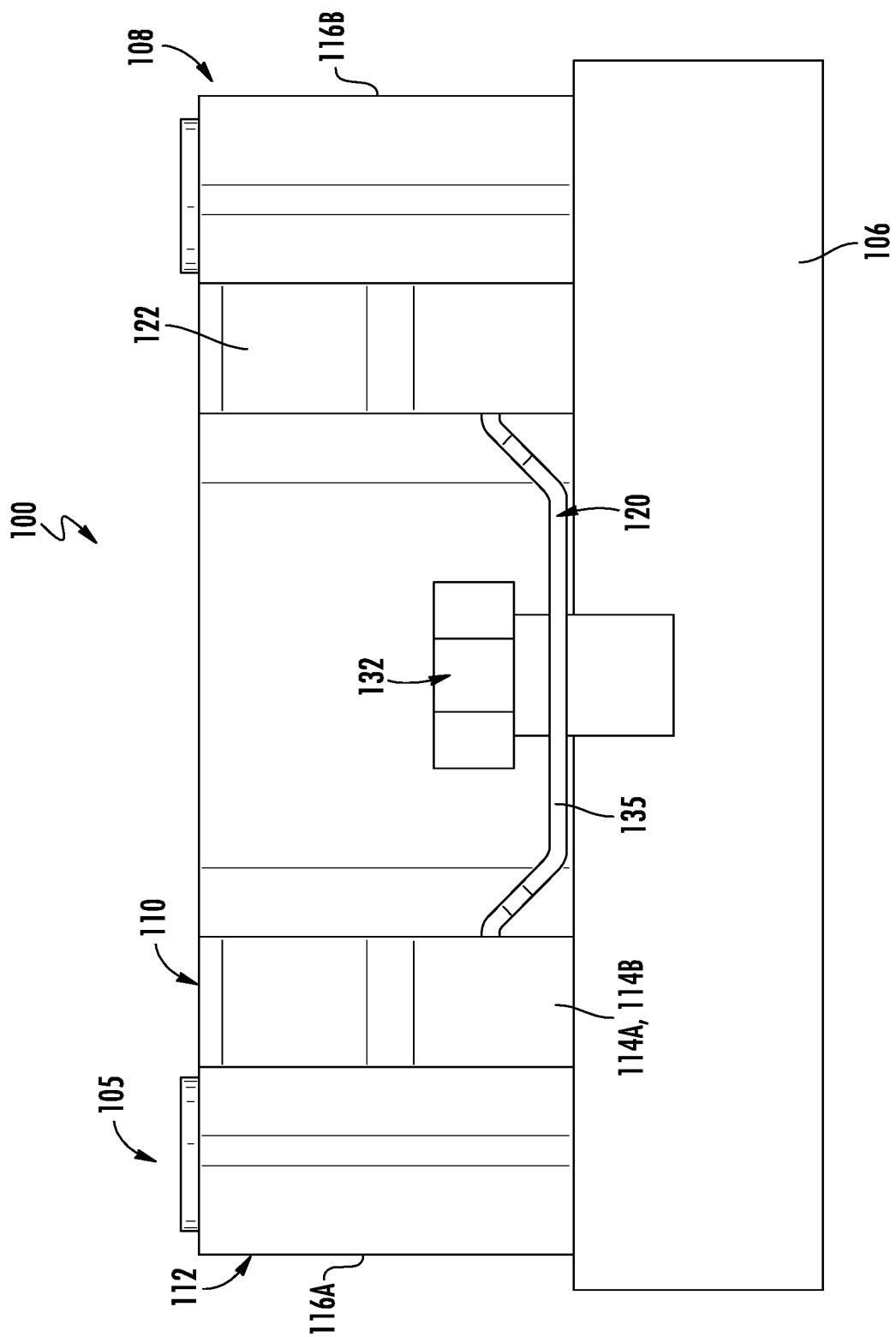
FIG. 3 is an end view of the semiconductor package and carrier of FIG. 1 according to exemplary embodiments of the present disclosure.

Referring now to FIGS. 1-3, an assembly 100 according to embodiments of the present disclosure will be described. As shown, the assembly 100 may include a power semiconductor module/package (hereinafter "package") 105 coupled to a carrier 106, which may be a substrate and/or a heatsink. The package 105 may include a housing 108 having a main body 110 and a wall 112 extending around a perimeter of the main body 110. The wall 112 may include a pair of end walls 114A, 114B and a pair of sidewalls 116A, 116B. As shown, the pair of end walls 114A, 115B and the pair of sidewalls 116A, 116B extend perpendicularly from the main body 110.

The main body 110 may further include a plurality of terminal openings 118 configured to receive one or more press-fit pins or terminals (not shown). The main body 110 and the wall 112 define an internal cavity housing one or more semiconductor devices coupled to the carrier 106. In some embodiments, the semiconductor devices may include one or more power semiconductor dies, such as one or more power metal-oxide-semiconductor field-effect transistors (power MOSFETs), one or more insulated-gate bipolar transistors (IGBTs), and the like.

In some embodiments, the carrier 106 may include multiple layers. For example, the carrier 106 may include a substrate or power electronic substrate coupled to a baseplate, which in turn may be coupled to a heat sink or the like. In other embodiments, the baseplate may be omitted, and the substrate may be directly coupled to a heat sink or the like. The power electronic substrate may include, by non-limiting example, a direct bonded copper (DBC) substrate, an active metal brazed (AMB) substrate, an insulated metal substrate (IMS), a ceramic substrate, and the like. In implementations in which the package 105 is not a power module, a different type of substrate could be used.

Each of the pins extending through the terminal openings 118 may be coupled to the carrier 106. For example, the carrier 106 may include connection traces thereon, some or all of which couple with electrical contacts either directly or indirectly. Each pin may, for example, be soldered to one of the connection traces, or coupled thereto using a conductive adhesive, and/or other connection mechanisms may be used. Some substrates may include lower pin couplers, such as hollow elements, each of which is coupled to one of the connection traces and each of which is configured to receive a lower end of one of the pins either through a friction fit, an adhesive, soldering, and the like. Each lower pin coupler could be attached to one of the connection traces using solder, a conductive adhesive, and the like.

The package 105 may further include one or more clamps 120 coupled to a set of support walls 122 of the housing 110. As shown, the support walls 122 and the clamps 120 may be coupled to, or extend from, the pair of end walls 114A, 114B. Each of the clamps 120 may include planar sections (not shown) coupled to or embedded within each of the support walls 122.

As further shown, an opening 130 of each of the clamps 120 may receive a fastener 132 (FIG. 3). The fastener 132, which may be a screw, bolt, rivet, adhesive, solder, etc., couples the package 105 to the carrier 106. In one non-limiting embodiment, the opening 130 and the fastener 132 may have a circular shape. During use, as the fastener 132 is inserted through the opening 130 and tightened (e.g., screwed) down into the carrier 106, a central section 135 of each clamp 120 may move towards the carrier 106. Thus, the central section 135 moves downward to firmly mate with or abut a top surface 136 of the carrier 106. Contact between central section 135 of the clamp 120 and the carrier 106 may increase heat transfer, resulting in decreased temperature of the components of the package 105.

Figure 4:
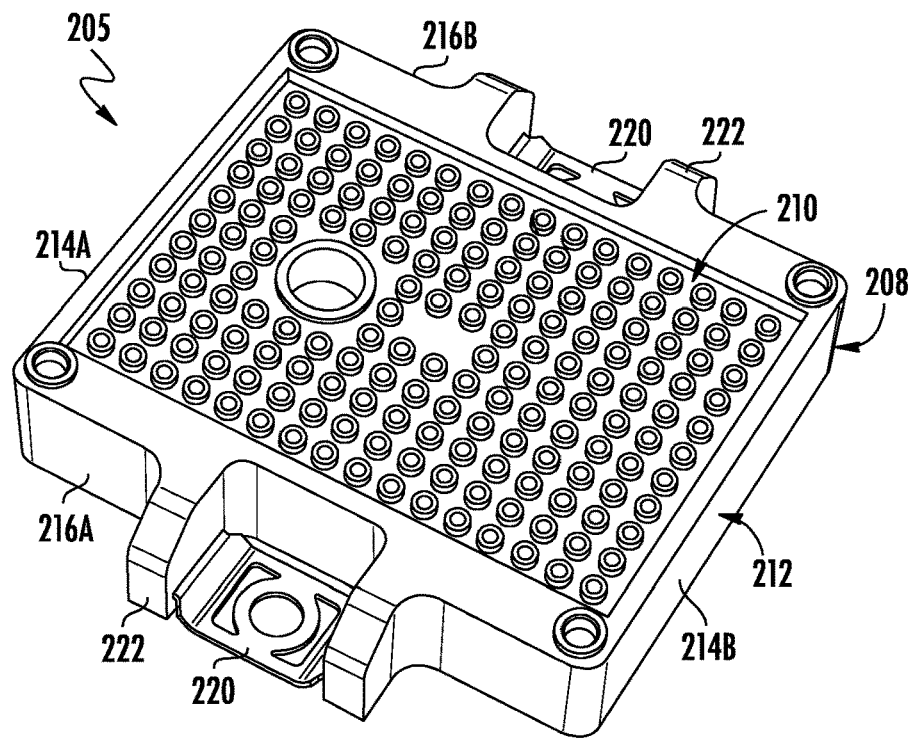
FIG. 4 is a perspective view of a semiconductor package according to exemplary embodiments of the present disclosure.
Figure 5:
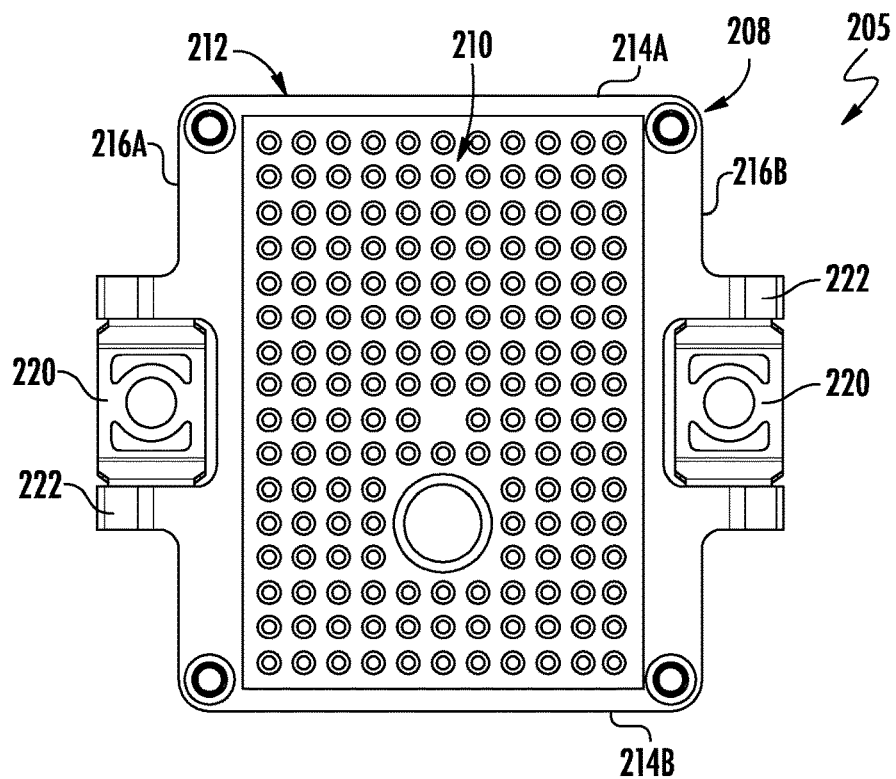
FIG. 5 is a top view of the semiconductor package of FIG. 4 according to exemplary embodiments of the present disclosure.

Turning now to FIGS. 4-5, an alternative package 205 according to embodiments of the present disclosure will be described. The package 205 may be the same or similar in many aspects to the package 105 described above. As such, only certain aspects of the package 205 will hereinafter be discussed for the sake of brevity. As shown, the package 205 may include a housing 208 having a main body 210 and a wall 212 extending around a perimeter of the main body 210. The wall 212 may include a pair of end walls 214A, 214B and a pair of sidewalls 216A, 216B. As shown, the pair of end walls 214A, 215B and the pair of sidewalls 216A, 216B extend perpendicularly from the main body 210. Together, the main body 210 and the wall 212 define an internal cavity (not shown) for housing one or more semiconductor devices.

The package 205 may further include one or more clamps 220 coupled to a set of support walls 222 of the housing 210. As shown, the support walls 222 and the clamps 220 may be coupled to, or extend from, the pair of sidewalls 216A, 216B. Each of the clamps 220 may include planar sections (not shown) coupled to or embedded within each of the support walls 222.

Figure 6:
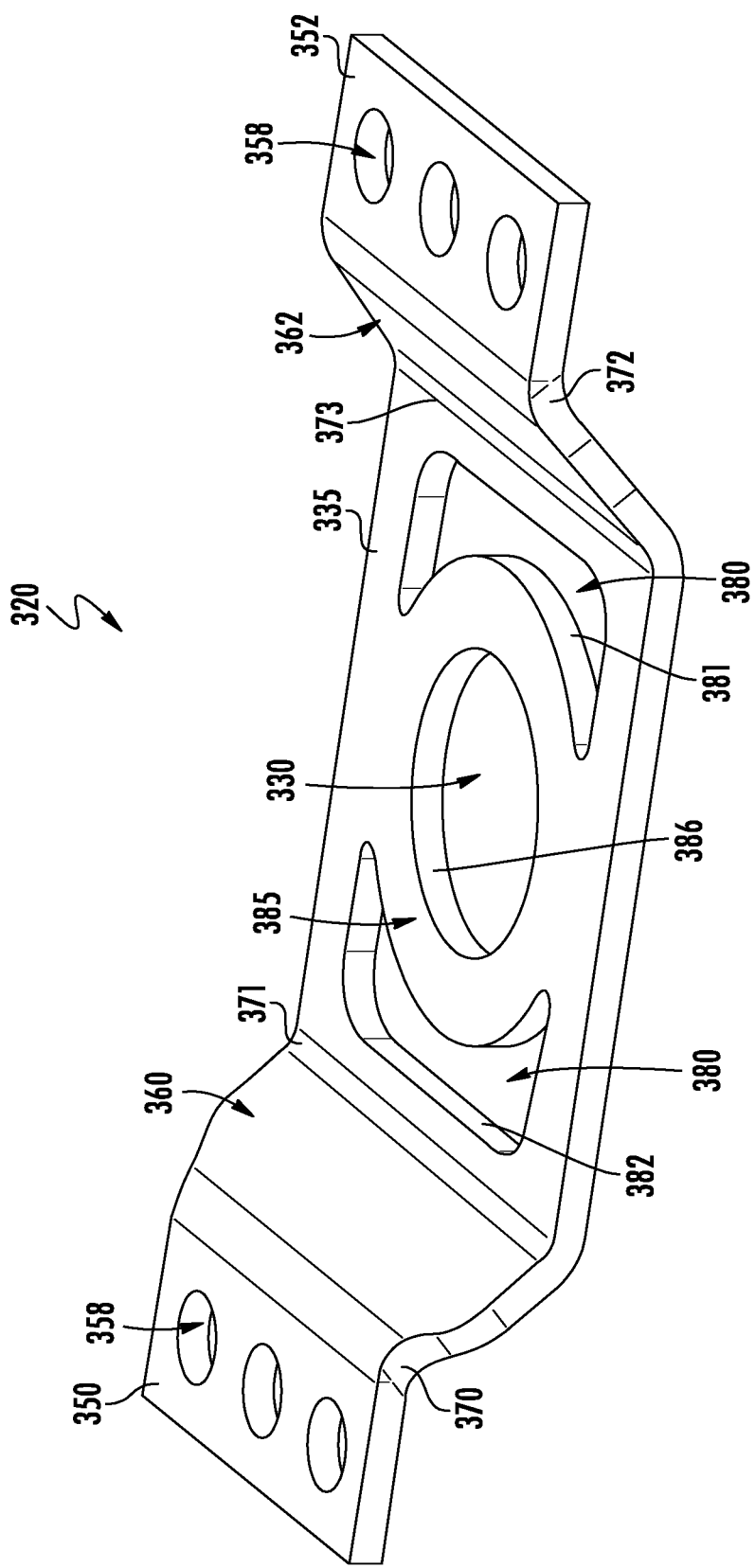
FIG. 6 is a perspective view of a clamp of a semiconductor package according to exemplary embodiments of the present disclosure.
Figure 7:
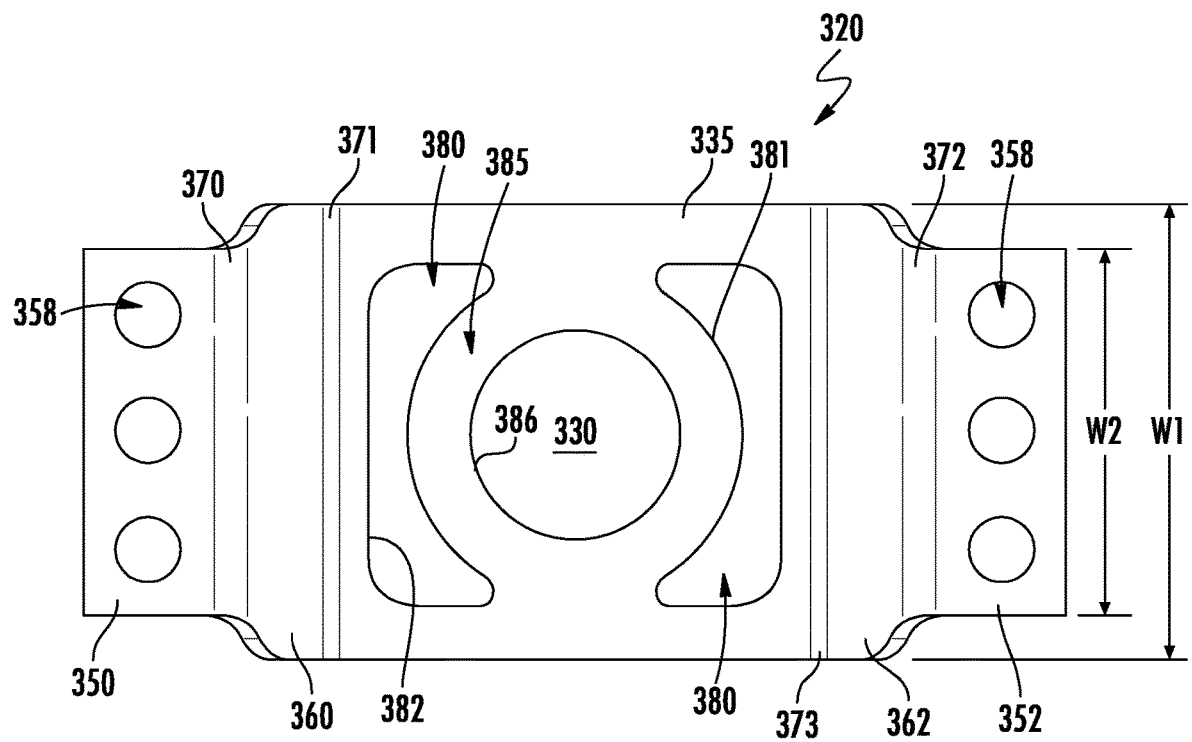
FIG. 7 is a top view of the clamp of FIG. 6 according to exemplary embodiments of the present disclosure.
Figure 8:
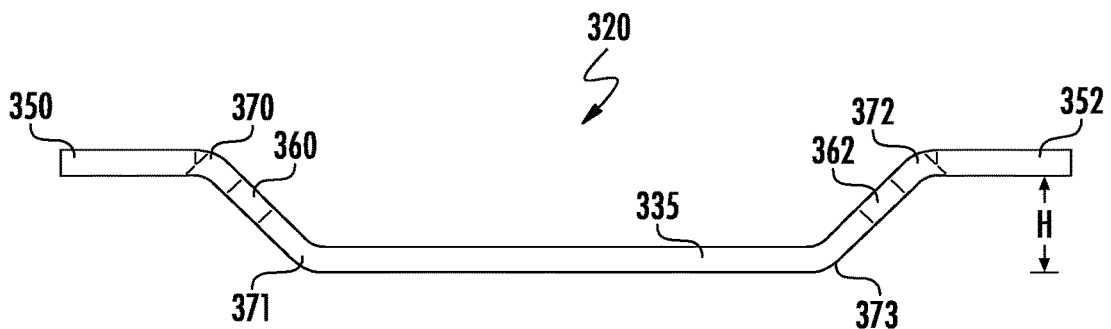
FIG. 8 is a side view of the clamp of FIG. 6 according to exemplary embodiments of the present disclosure.

Turning now to FIGS. 6-8, an exemplary clamp 320 according to embodiments of the present disclosure will be described. The clamp 320 may be the same or similar to the clamp 120 and the clamp 220 described above. As shown, the clamp 320 may include a first planar section 350, a second planar section 352, and a central/third section 335 between the first and second planar sections 350, 352. In some embodiments, the first and second planar sections 350, 352 may each include one or more attachment openings 358 to increase coupling between the clamp 320 and support walls of a package. For example, during package formation, an injection molded material (e.g., polybutylene terephthalate (PBT) or polyphenylene sulfide (PPS)) may enter the attachment openings 358 to provide increased attachment between the clamp 320 and the package as the injection molded material solidifies. Although shown as generally circular, it'll be appreciated that the attachment openings 358 may take on any different shape, configuration, quantity, etc.

The central section 335 may be connected to the first and second planar sections 350, 352 by a pair of angled portions. For example, a first angled portion 360 may connect the first planar section 350 to the central section 335, and a second angled portion 362 may connect the second planar section 352 to the central section 335. In some embodiments, a first bend 370 may connect the first angled portion 360 to the first planar section 350, a second bend 371 may connect the first angled portion 360 to the central section 335, a third bend 372 may connect the second angled portion 362 to the second planar section 352, and a fourth bend 373 may connect the second angled portion 362 to the central section 335.

As best demonstrated in FIG. 8, the first and second planar sections 350, 352 extend along a first plane, and the central section 335 extends along a second plane, different than the first plane. The first and second planes may generally extend parallel to one another, as demonstrated by a difference in plane height ('H'). As best demonstrated in FIG. 7, a width 'W1' of the central section 335 and the first and second angled portions 360, 362 is greater than a width 'W2' of the first and second planar sections 350, 352. As a result, flexibility may be increased and stress decreased due to both the difference in width and plane position/height between the central section 335 and the first and second planar sections 350, 352.

Stress in the clamp 320 can further be managed by providing a set of stress relief openings 380 through the central section 335. As shown, the stress relief openings 380 may be formed between a central opening 330 and respective first and second angled portions 360, 362. Each of the stress relief openings may be defined, in part, by a first edge or surface 381 having a curved profile and a second edge or surface 382 having a straight profile. The first edge 381 may correspond to an outer edge of a central ring 385 operable to receive a fastener therein. As shown, an interior edge or surface 386 of the central ring 385 defines the central opening 330. During use, the stress relief openings 380 permit a degree of flexing and rotation of the central ring 385 as the fastener is being tightened to the carrier (not shown).

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure. The directional references do not create limitations, particularly as to the position, orientation, or use of the disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor package, comprising:
   a housing, comprising:
      a wall extending from a main body; and
      a set of support walls extending from the wall; and
   a clamp extending between the set of support walls, the clamp comprising:
      a first planar section coupled to a first support wall of the set of support walls, the first planar section comprising a first width;
      a second planar section coupled to a second support wall of the set of support walls, the second planar section comprising the first width; and
      a third planar section between the first and second planar sections, the third planar section including an opening operable to receive a fastener, and a plurality of stress relief openings, the third planar section comprising a second width, wherein the second width is greater than the first width;
      wherein the first planar section and the second planar section are spaced apart from the third planar section along a direction perpendicular to a plane defined by an upper surface of the third planar section.

2. The semiconductor package of claim 1, the clamp further comprising:
   a first angled portion connecting the third planar section to the first planar section; and
   a second angled portion connecting the third planar section to the second planar section.

3. The semiconductor package of claim 1, the clamp further comprising at least one attachment opening formed through the first planar section or the second planar section.

4. The semiconductor package of claim 1, wherein each of the plurality of stress relief openings is defined by a first edge having a curved profile and a second edge having a straight profile.

5. The semiconductor package of claim 1, the third planar section including a central ring, wherein an interior edge of the central ring defines the opening.

6. The semiconductor package of claim 1, the wall comprising a pair of end walls and a pair of sidewalls, wherein the pair of end walls and the pair of sidewalls extend perpendicularly from the main body.

7. The semiconductor package of claim 6, wherein the set of support walls extend perpendicularly from the pair of end walls or the pair of sidewalls.

8. The semiconductor package of claim 1, the housing further comprising a plurality of terminal openings formed through the main body.

9. A power semiconductor package, comprising:
   a housing, comprising:
      a wall extending from a main body; and a first set of support walls and a second set of support walls extending from the wall; and a first clamp extending between the first set of support walls and a second clamp extending between the second set of support walls, each of the first and second clamps comprising:

a first planar section coupled to a first support wall of the set of support walls, the first planar section comprising a first width;

a second planar section coupled to a second support wall of the set of support walls, the second planar section comprising the first width; and a third planar section between the first and second planar sections, the third planar section including an opening operable to receive a fastener, and a plurality of stress relief openings, the third planar section comprising a second width, wherein the second width is greater than the first width;

wherein the first planar section and the second planar section are spaced apart from the third planar section along a direction perpendicular to a plane defined by an upper surface of the third planar section.

10. The power semiconductor package of claim 9, each of the first and second clamps further comprising:

a first angled portion connecting the third planar section to the first planar section; and a second angled portion connecting the third planar section to the second planar section.

11. The power semiconductor package of claim 9, each of the first and second clamps further comprising at least one attachment opening formed through the first planar section or the second planar section.

12. The semiconductor package of claim 9, wherein each of the plurality of stress relief openings is defined by a first edge having a curved profile and a second edge having a straight profile.

13. The semiconductor package of claim 9, the third planar section including a central ring, wherein an interior edge of the central ring defines the opening.

14. The semiconductor package of claim 9, the wall comprising a pair of end walls and a pair of sidewalls, wherein the pair of end walls and the pair of sidewalls extend perpendicularly from the main body.

15. An assembly, comprising:

a heatsink;

a power semiconductor module coupled to the heatsink, the power semiconductor module comprising:

a housing including a wall extending from a main body and a set of support walls extending from the wall; and a clamp extending between the set of support walls, the clamp comprising:

a first planar section coupled to a first support wall of the set of support walls, the first planar section comprising a first width;

a second planar section coupled to a second support wall of the set of support walls, the second planar section comprising the first width; and a third planar section between the first and second planar sections, the third planar section including an opening operable to receive a fastener, and a plurality of stress relief openings, the third planar section comprising a second width, wherein the second width is greater than the first width;

wherein the first planar section and the second planar section are spaced apart from the third planar section along a direction perpendicular to a plane defined by an upper surface of the third planar section.

16. The assembly of claim 15, the clamp further comprising:

a first angled portion connecting the third planar section to the first planar section; and a second angled portion connecting the third planar section to the second planar section.

17. The assembly of claim 15, the clamp further comprising at least one attachment opening formed through the first planar section and the second planar section.

18. The assembly of claim 15, wherein each of the plurality of stress relief openings is defined by a first edge having a curved profile and a second edge having a straight profile, wherein the opening through the third planar section is defined by an interior edge of a central ring.

19. The assembly of claim 15, the wall comprising a pair of end walls and a pair of sidewalls, wherein the pair of end walls and the pair of sidewalls extend perpendicularly from the main body, and wherein the set of support walls extend perpendicularly from the pair of end walls or the pair of sidewalls.

* * * * *